(12) United States Patent
Huang et al.

(10) Patent No.: US 10,192,916 B2
(45) Date of Patent: Jan. 29, 2019

(54) METHODS OF FABRICATING SOLID-STATE IMAGING DEVICES HAVING FLAT MICROLENSES

(71) Applicant: VisEra Technologies Company Limited, Hsin-Chu (TW)

(72) Inventors: Tzu-Wei Huang, Zhubei (TW); Ji-Hong Lin, Kaohsiung (TW); Huang-Jen Chen, Keelung (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 15/617,523

(22) Filed: Jun. 8, 2017

(65) Prior Publication Data

US 2018/0358397 A1 Dec. 13, 2018

(51) Int. Cl.
*H01L 31/0232* (2014.01)
*H01L 27/146* (2006.01)
*H01L 21/311* (2006.01)

(52) U.S. Cl.
CPC .... *H01L 27/14627* (2013.01); *H01L 27/1462* (2013.01); *H01L 27/14621* (2013.01); *H01L 27/14645* (2013.01); *H01L 27/14685* (2013.01); *H01L 21/31116* (2013.01); *H01L 21/31144* (2013.01); *H01L 27/14636* (2013.01)

(58) Field of Classification Search
None
See application file for complete search history.

(56) References Cited

U.S. PATENT DOCUMENTS

| 2005/0161585 A1 | 7/2005 | Nakashima et al. |
| 2005/0208692 A1* | 9/2005 | Lee ............... H01L 27/14627 438/29 |
| 2009/0021629 A1* | 1/2009 | Yamada ........... H01L 27/14627 348/311 |

(Continued)

FOREIGN PATENT DOCUMENTS

| JP | H0661462 A | 4/1994 |
| JP | 2009218341 A | 9/2009 |
| JP | 2012134261 A | 12/2012 |

OTHER PUBLICATIONS

Office Action dated Dec. 26, 2017 in corresponding TW Application No. 106132938 (6 pages).

(Continued)

*Primary Examiner* — Long Pham
(74) *Attorney, Agent, or Firm* — Muncy, Geissler, Olds & Lowe, P.C.

(57) ABSTRACT

Methods of fabricating solid-state imaging devices having a flat microlens array are provided. The method includes providing a semiconductor substrate having a plurality of photoelectric conversion elements. A color filter layer is formed above the semiconductor substrate. A lens material layer is formed on the color filter layer. A hard mask having a lens-shaped pattern is formed on the lens material layer. The method further includes etching both the hard mask and the lens material layer to form a microlens with a flat top surface that is formed from the lens material layer, and to leave a portion of the hard mask on the flat top surface of the microlens. The method also includes removing the portion of the hard mask that remains on the microlens.

14 Claims, 12 Drawing Sheets

(56) References Cited

U.S. PATENT DOCUMENTS

2009/0224348 A1* 9/2009 Matsushita ....... H01L 27/14627
257/432
2012/0086093 A1 4/2012 Otsuka et al.
2015/0270298 A1 9/2015 Lin et al.

OTHER PUBLICATIONS

TIPO. Office Action to corresponding to TW Application No. 106132938. dated Nov. 28, 2018. 6 pages.
An Office Action from the corresponding Japanese Application dated Oct. 16, 2018. 3 pages.

* cited by examiner

METHODS OF FABRICATING SOLID-STATE IMAGING DEVICES HAVING FLAT MICROLENSES

BACKGROUND

Field of the Invention

The invention relates to imaging devices, and more particularly, to solid-state imaging devices having microlenses with a flat top surface and methods of fabricating the same.

Description of the Related Art

Image sensors have been widely used in various image-capturing apparatuses, for example video cameras, digital cameras, and the like. Generally, solid-state imaging devices such as charge-coupled device (CCD) sensors or complementary metal-oxide semiconductor (CMOS) sensors have photoelectric transducers like photodiodes for converting light into electric charges. The photodiodes are formed in a semiconductor substrate such as a silicon chip. Signal charges corresponding to photoelectrons generated in the photodiodes are obtained by a CCD-type or a CMOS-type reading circuit.

In solid-state imaging devices, the photodiodes are arranged in a pixel array. In addition, the solid-state imaging devices have a microlens array disposed over the photodiodes. Each microlens element of a microlens array is aligned with a corresponding photodiode in each pixel. In general, a microlens element is a condensing lens with a semi-spherical shape which is used to focus incident light upon the photodiode at a focus point. Microlens arrays are usually made of a photoresist material, and are fabricated by exposure, development and reflow processes performed in sequence.

BRIEF SUMMARY

Solid-state imaging devices usually have multiple pixels arranged in an array. Each pixel of a solid-state imaging device has a pixel size that can be defined by the pixel width multiplied by the pixel length, or defined by the pixel pitch. Solid-state imaging devices may have a small pixel size, for example a pixel pitch of 2 µm to 4 µm. In addition, solid-state imaging devices may have a large pixel size, for example a pixel pitch of 9 µm to 15 µm. In embodiments of the disclosure, solid-state imaging devices have a large pixel size, for example a pixel pitch greater than 8 µm or greater than 10 µm, and the pixel pitch may be smaller than 30 µm.

When a solid-state imaging device has a small pixel size, a microlens in the form of a condensing lens with a semi-spherical shape can be used to focus incident light upon a photodiode at a focal point in a small area. When the solid-state imaging device has a large pixel size, the effective area of a photoelectric conversion element in one pixel is larger than that of a solid-state imaging device having a small pixel size. Therefore, the solid-state imaging devices having a large pixel size allow incident light to be focused upon a photoelectric conversion element in a large area that is substantially equal to the area of the photoelectric conversion element.

According to embodiments of the disclosure, solid-state imaging devices having microlenses with a flat top surface are provided. Moreover, methods of fabricating the solid-state imaging devices having microlenses with a flat top surface are also provided. Through the flat top surface of the microlenses, incident light can be focused in a big focal point that is substantially equal to the area of a photoelectric conversion element in one pixel. As a result, the amount of incident light received by the photoelectric conversion elements of the solid-state imaging devices is increased. Therefore, the sensitivity of the solid-state imaging devices is enhanced.

In some embodiments, a method of fabricating a solid-state imaging device is provided. The method includes providing a semiconductor substrate having a plurality of photoelectric conversion elements and forming a color filter layer above the semiconductor substrate. The method also includes forming a lens material layer on the color filter layer and forming a hard mask having a lens-shaped pattern on the lens material layer. The method further includes etching both the hard mask and the lens material layer to form a microlens with a flat top surface from the lens material layer and to leave a portion of the hard mask on the flat top surface of the microlens after the etching process is finished. In addition, the method includes removing the portion of the hard mask that remains on the flat top surface of the microlens.

In some other embodiments, a method of fabricating a solid-state imaging device is provided. The method includes providing a semiconductor substrate having a plurality of photoelectric conversion elements and forming a color filter layer above the semiconductor substrate. The method also includes forming a lens material layer on the color filter layer and forming a patterned photoresist above the lens material layer. The method further includes forming a hard mask having a lens-shaped pattern on the patterned photoresist. In addition, the method includes etching the hard mask, the patterned photoresist and the lens material layer to form a microlens with a flat top surface from the lens material layer, and to leave a portion of the patterned photoresist and a portion of the hard mask above the flat top surface of the microlens after the etching process is finished. The method also includes removing the portion of the patterned photoresist and the portion of the hard mask remained above the flat top surface of the microlens.

In some embodiments, a solid-state imaging device is provided. The solid-state imaging device includes a semiconductor substrate having a plurality of photoelectric conversion elements, and a color filter layer disposed above the semiconductor substrate. The solid-state imaging device also includes a microlens with a flat top surface disposed on the color filter layer. The flat top surface of the microlens is directly above the photoelectric conversion element. Moreover, the area of the flat top surface of the microlens is equal to the area of the photoelectric conversion element.

A detailed description is given in the following embodiments with reference to the accompanying drawings.

BRIEF DESCRIPTION OF DRAWINGS

The embodiments of the disclosure can be more fully understood by reading the subsequent detailed description and examples with references made to the accompanying drawings. For clarity of illustration, various elements in the drawings may not be drawn in scale, wherein.

DETAILED DESCRIPTION

The following description is the contemplated mode of carrying out some embodiments of the disclosure. This description is made for the purpose of illustrating the general principles of some embodiments of the invention and should not be taken in a limiting sense. The scope of the invention is best determined by reference to the appended claims.

According to embodiments of the disclosure, solid-state imaging devices having a microlens with a flat top surface are provided. In addition, methods of fabricating the solid-state imaging devices are also provided. The solid-state imaging devices have a large pixel size, for example, a pixel pitch greater than 8 μm or greater than 10 μm, and the pixel pitch may be smaller than 30 μm. Through the flat top surface of the microlens, incident light can be focused in a big focus spot that is substantially equal to the area of a photoelectric conversion element in one pixel. The area of the photoelectric conversion element is equal to or greater than 75% of the area of one pixel. As a result, the amount of incident light received by the photoelectric conversion element is increased. Therefore, the sensitivity of the solid-state imaging devices having a large pixel size is enhanced.

Figure 1A:
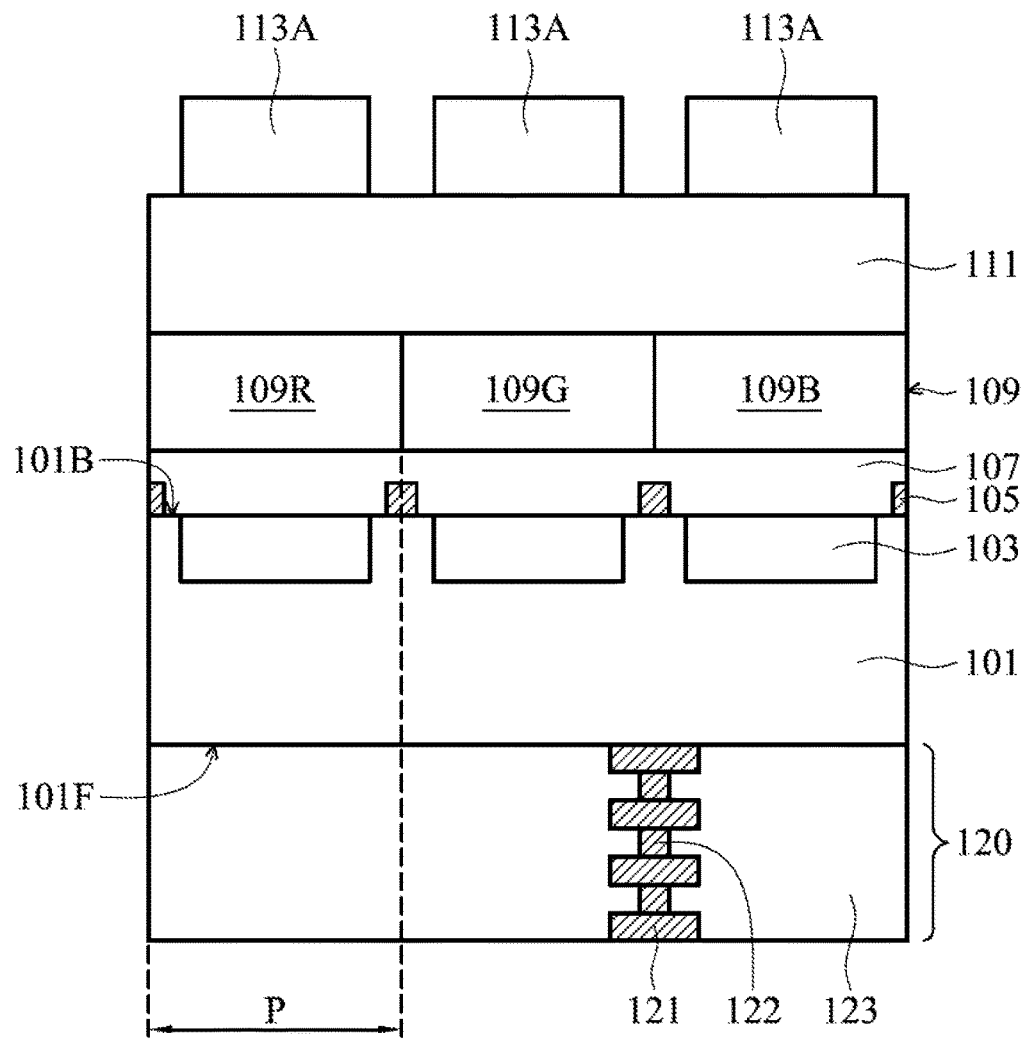
FIGS. 1A to 1E show schematic partial cross sections of various intermediate stages of a method of fabricating a solid-state imaging device according to some embodiments.
Figure 1B:
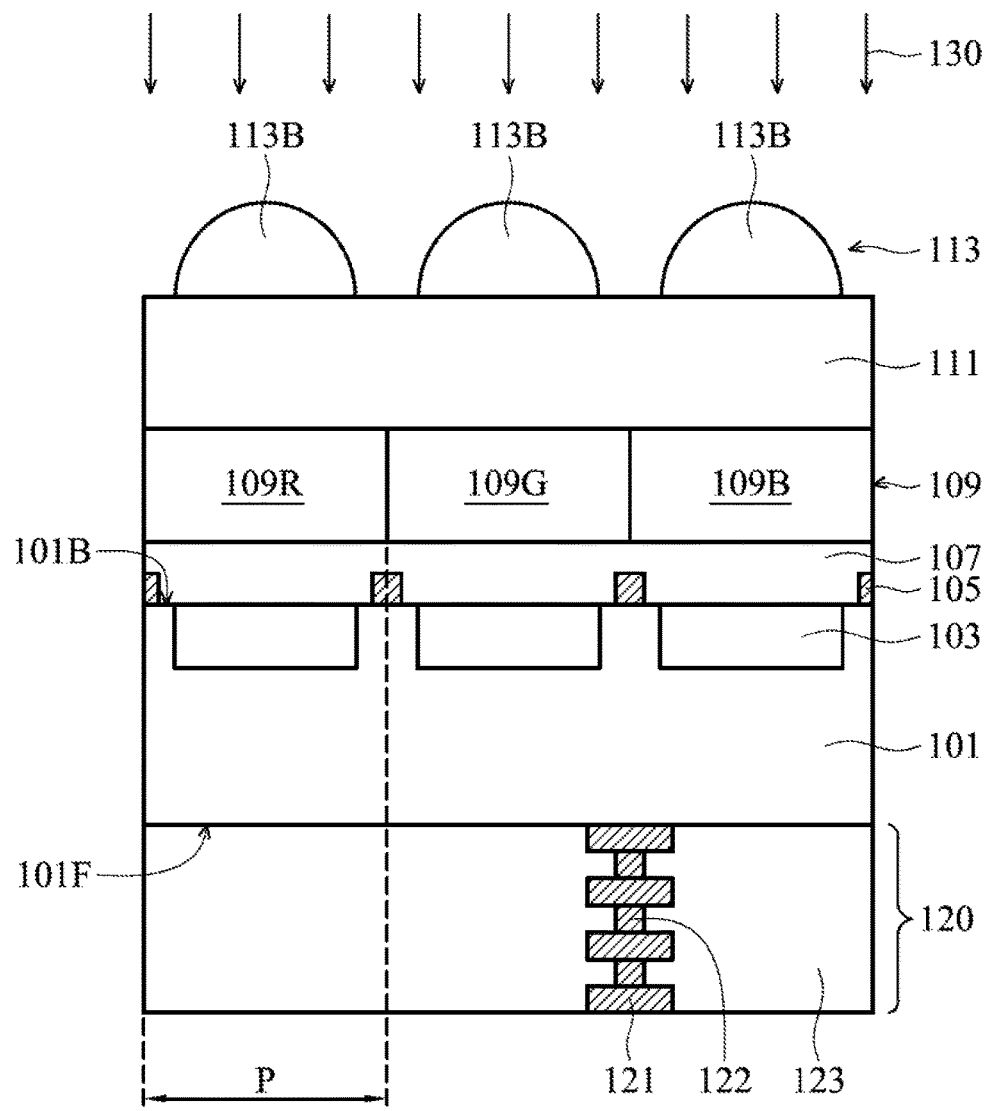
Figure 1C:
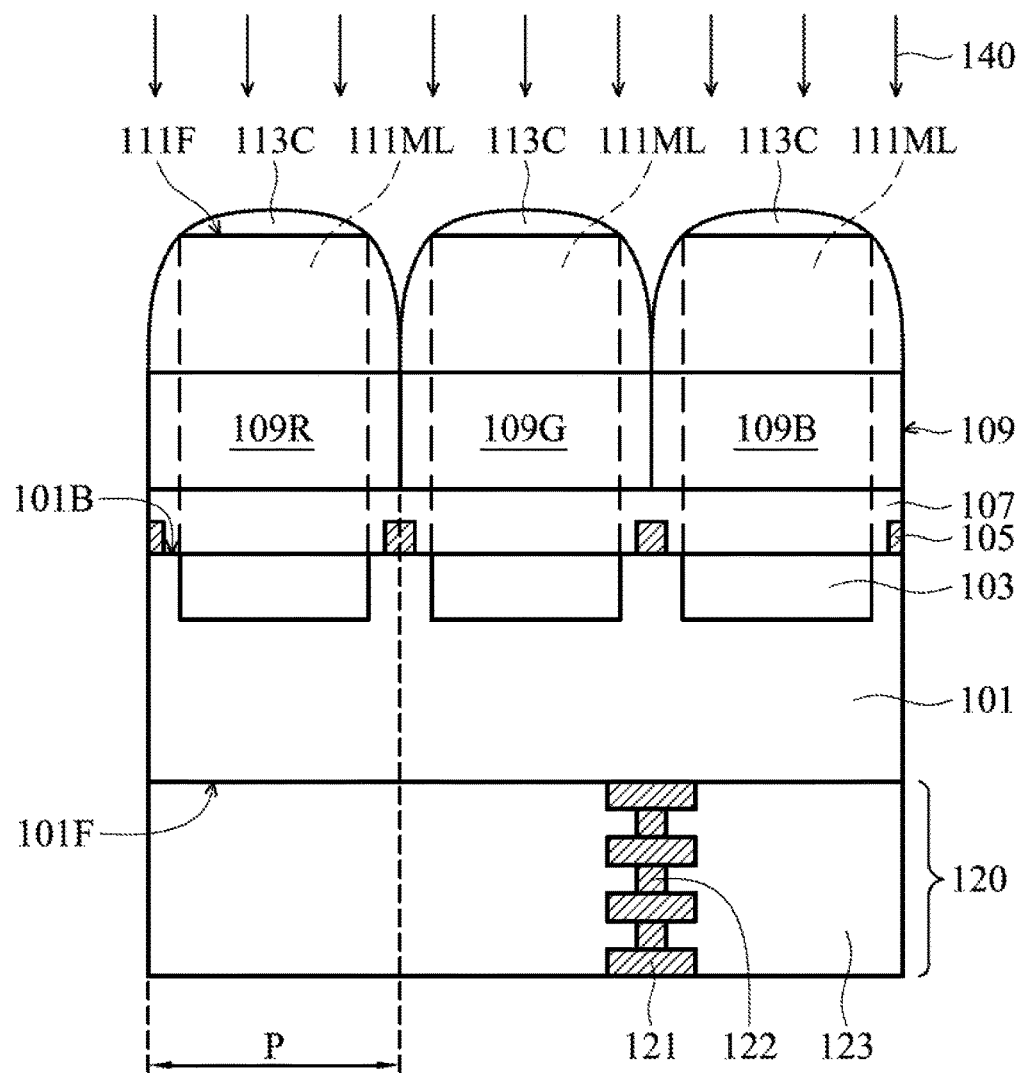
Figure 1D:
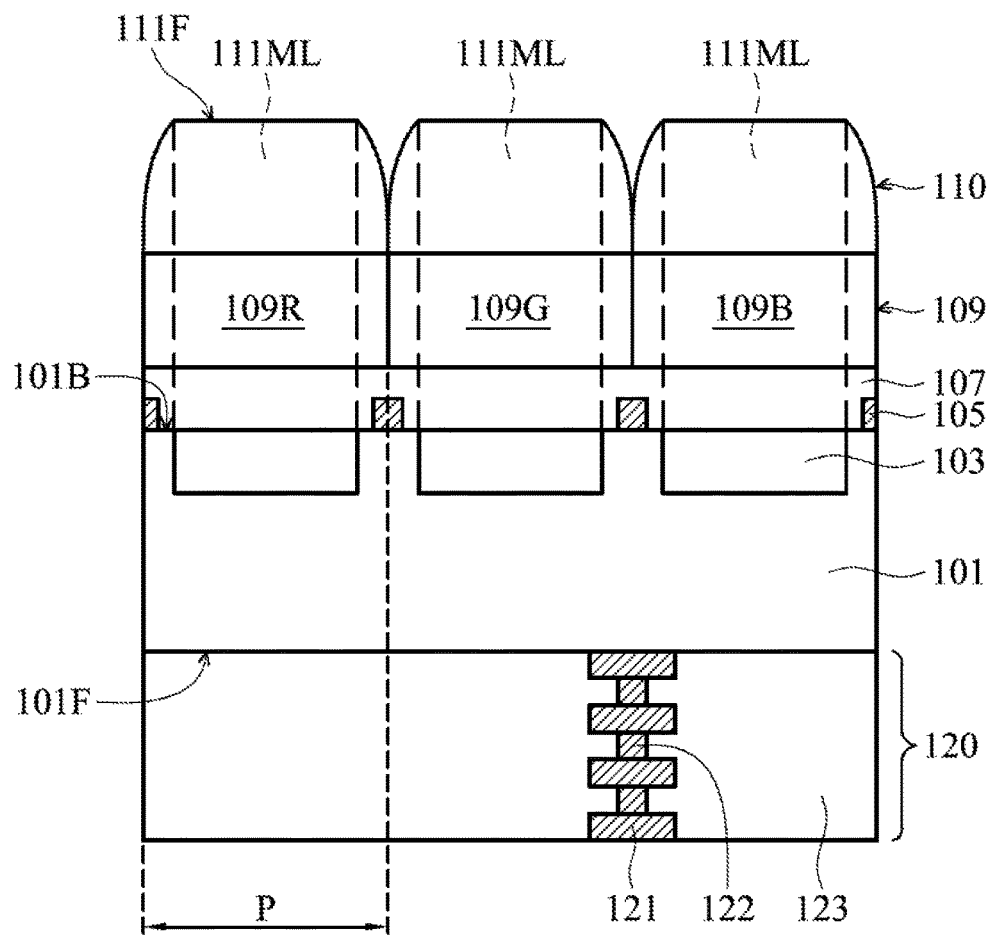
Figure 1E:
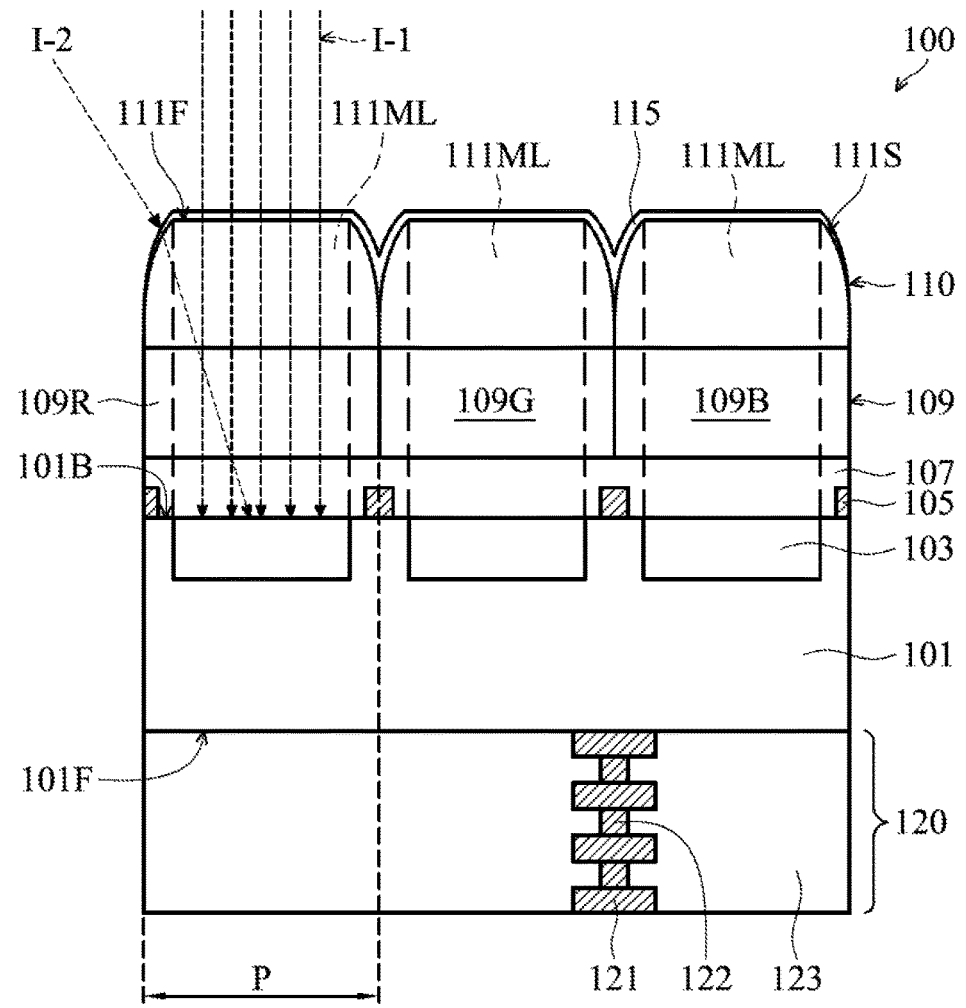

FIGS. 1A to 1E show schematic partial cross sections of various intermediate stages of a method of fabricating a solid-state imaging device 100 of FIG. 1E according to some embodiments. Referring to FIG. 1A, a semiconductor substrate 101 having a plurality of photoelectric conversion elements 103, for example photodiodes, formed therein is provided. The material of the semiconductor substrate 101 includes silicon, germanium, silicon-germanium alloy, or another compound semiconductor material such as gallium-arsenide or indium-arsenide. Alternatively, the semiconductor substrate 101 may be a semiconductor-on-insulator (SOI) substrate.

In some embodiments, the solid-state imaging device 100 as shown in FIG. 1E is a back-side illumination (BSI) image sensor, for example a BSI CMOS image sensor (BSI-typed CIS). In BSI image sensors, an interconnection layer 120 is formed on a front-side surface 101F of the semiconductor substrate 101 and disposed below the semiconductor substrate 101 as shown in FIGS. 1A to 1E. The interconnection layer 120 includes several metal layers 121 and several vias 122 disposed in several dielectric layers 123. The metal layers 121 are electrically connected with each other through the vias 122. In BSI image sensors, the photoelectric conversion elements 103 are disposed near a back-side surface 101B of the semiconductor substrate 101. Each of the photoelectric conversion elements 103 is disposed in one individual pixel P of the solid-state imaging device 100. Incident light illuminated on the BSI image sensors reaches the photoelectric conversion elements 103 without passing through the interconnection layer 120.

In some other embodiments, the solid-state imaging device is a front-side illumination (FSI) image sensor, for example a FSI CMOS image sensor (FSI-typed CIS). In FSI image sensors, the interconnection layer 120 is reversed to be disposed above the semiconductor substrate 101. Incident light illuminated on the FSI image sensors passes through the interconnection layer 120 and then reaches the photoelectric conversion elements 103.

Referring to FIG. 1A again, in some embodiments, a light-shielding layer 105 is formed on the semiconductor substrate 101. The light-shielding layer 105 may be a metal grid that consists of a plurality of partitions position between adjacent photoelectric conversion elements 103. The metal grid of the light-shielding layer 105 has multiple squares, and each square of the metal grid corresponds to one individual pixel P of the solid-state imaging device 100. In addition, a planarization layer 107 is formed on the light-shielding layer 105 and to fill the square gaps of the metal grid of the light-shielding layer 105.

Referring to FIG. 1A again, in some embodiments, a color filter layer 109 is formed on the planarization layer 107 and above the semiconductor substrate 101. The color filter layer 109 includes a plurality of color filter components, such as color filter components 109R, 109G and 109B which are colored red, green and blue, respectively. In other embodiments, the color filter components have other colors and the colors may be arranged in other arrangements. Each color filter component 109R, 109G or 109B individually corresponds to one photoelectric conversion element 103 in each pixel P of the solid-state imaging device 100.

In some other embodiments, the light-shielding layer 105 is formed on the same level of the color filter layer 109. The partitions of the light-shielding layer 105 are disposed between the color filter components 109R, 109G and 109B. In the embodiments, the planarization layer 107 can be omitted.

According to some embodiments, as shown in FIG. 1A, a lens material layer 111 is formed on the color filter layer 109. The lens material layer 111 may be an organic material, for example: acrylic resin or epoxy resin, and may be formed by a spin-coating process. Alternatively, the lens material layer 111 may be an inorganic material, for example: $TiO_2$, $SiO_2$ or polysiloxane, and may be formed by a chemical vapor deposition (CVD) process or a physical vapor deposition (PVD) process. The thickness of the lens material layer 111 may be in a range of 0.5 μm to 3 μm.

Next, a hard mask material layer (not shown in FIG. 1A) is formed on the lens material layer 111. In some embodiments, the hard mask material layer is made of a photosensitive organic material, for example: acrylic resin or epoxy resin. The hard mask material layer is patterned by a photolithography technology including exposure and development processes to form multiple hard mask segments 113A on the lens material layer 111 as shown in FIG. 1A.

The multiple hard mask segments 113A are subsequently deformed into multiple lens-shaped patterns 113B of a hard mask 113 as shown in FIG. 1B by a reflow process. The reflow process is performed by heating the multiple hard mask segments 113A at a temperature higher than the glass transition temperature of the hard mask material layer. In some embodiments, the lens-shaped patterns 113B of the hard mask 113 have a maximum height in a range of 4 μm to 15 μm.

As shown in FIG. 1B, both the hard mask 113 and the lens material layer 111 are etched by a first dry-etching process 130. In some embodiments, the hard mask 113 and the lens material layer 111 are simultaneously etched during the first dry-etching process 130. The first dry-etch process 130 is performed using a fluorine-containing etchant, for example gas of $CF_4$, $CHF_3$, $C_4F_8$, $NF_3$ or a combination thereof. The material of the hard mask 113 has an etching rate that is different from the etching rate of the material of the lens material layer 111 in the first dry-etching process 130. In the embodiments, during the first dry-etching process 130, the etching rate of the hard mask 113 is greater than the etching rate of the lens material layer 111. In some embodiments, an etching rate ratio of the materials of the hard mask 113 to the lens material layer 111 is in a range of 1:1 to 1.2:1.

After the first dry-etching process 130 is finished, a partial profile of the lens-shaped patterns 113B of the hard mask 113 is transferred to the lens material layer 111 to form multiple microlenses 111ML. In the embodiments, each microlens 111ML has a flat top surface 111F as shown in FIG. 1C. Moreover, after the first dry-etching process 130 is finished, a portion of the lens-shaped pattern 113B that remains on the flat top surface 111F of the microlens 111ML, which is shown as a remaining portion 113C in FIG. 1C. After the first dry-etching process 130 is finished, the lens-shaped pattern 113B of the hard mask 113 is not completely removed. Therefore, the process time of the first dry-etching process 130 is reduced.

Referring to FIG. 1C again, subsequently, a second dry-etching process 140 is performed to remove the remaining portion 113C of the hard mask 113 on the flat top surface 111F of the microlens 111ML. The second dry-etching process 140 is performed using an etchant that is different from the fluorine-containing etchant used in the first dry-etching process 130. The etchant used in the second dry-etching process 140 is for example a gas mixture of $O_2$, $CO_2$, $N_2$ or a combination thereof mixed with Ar gas, wherein the Ar gas is used as a diluting gas or for healing. The second dry-etching process 140 only removes the material of the hard mask 113 and does not remove the material of the lens material layer 111.

As shown in FIG. 1D, after the remaining portion 113C of the hard mask 113 is removed, the flat top surface 111F of the microlens 111ML is exposed. The multiple microlenses 111ML are arranged into a microlens array 110. Because each microlens 111ML of the microlens array 110 has the flat top surface 111F, the microlens array 110 is also referred to as a flat microlens array. The flat top surface 111F of the microlens 111ML is directly above the photoelectric conversion element 103. Moreover, the area of the flat top surface 111F of the microlens 111ML is equal to the area of the photoelectric conversion element 103.

Referring to FIG. 1E, a passivation film 115 is conformally formed on the flat top surface 111F and curved sidewalls 111S of the microlenses 111ML to complete the solid-state imaging device 100. In some embodiments, the passivation film 115 is formed by a chemical vapor deposition (CVD) process. The material of the passivation film 115 may be silicon oxide, silicon nitride, silicon oxynitride or a combination thereof.

Figure 2:
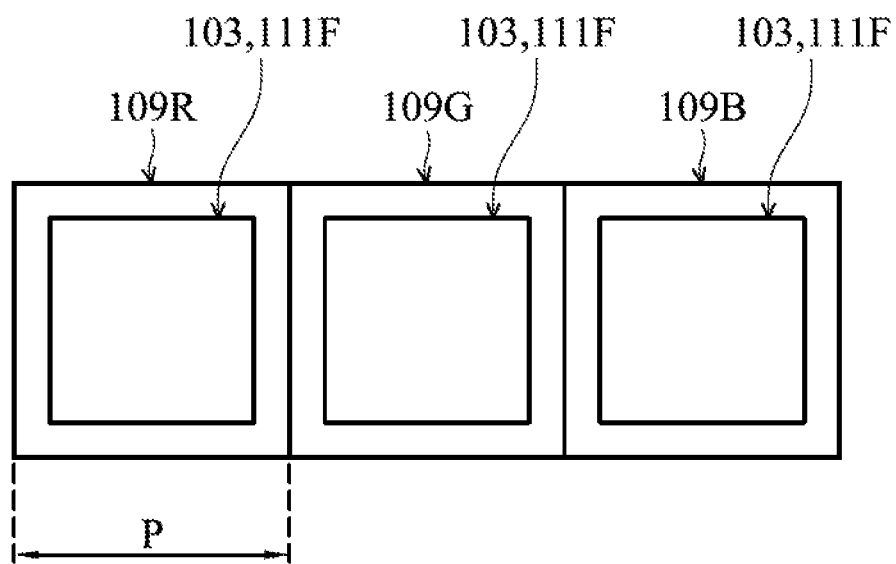
FIG. 2 shows a schematic partial plane view of the solid-state imaging device of FIG. 1E to illustrate the relationships of the areas of several elements according to some embodiments.

FIG. 2 shows a schematic partial plane view of the solid-state imaging device 100 of FIG. 1E to illustrate the relationships of the areas of the flat top surface 111F of the microlens 111M, the photoelectric conversion element 103 and the color filter components 109R, 109G and 109B according to some embodiments. As shown in FIG. 2, the area of the flat top surface 111F of the microlens 111M is equal to and is aligned with the area of the photoelectric conversion element 103 in one respective pixel P. The area of the respective color filter components 109R, 109G or 109B is equal to the area of one pixel P. Moreover, in some embodiments, the area of the photoelectric conversion element 103 is equal to or greater than 75% of the area of one pixel P.

Referring to FIG. 1E again, incident light I-1 illuminated on the flat top surface 111F of the microlens 111M, travels in straight lines through several element layers of the solid-state imaging device 100, and then reaches the photoelectric conversion element 103. Therefore, incident light I-1 can be focused in a big focus spot that is substantially equal to the area of one photoelectric conversion element 103 by the flat top surface 111F of the microlens 111M. In addition, incident light I-2 with a larger incident angle than that of incident light I-1 can be refracted by the curved sidewalls 111S of the microlens 111ML, and then reaches the photoelectric conversion element 103. As a result, the amount of incident light received by the photoelectric conversion elements 103 of the solid-state imaging device 100 is increased. In other words, the flat microlens array of the solid-state imaging device 100 can efficiently gather external light into the photoelectric conversion element 103. Therefore, the sensitivity of the solid-state imaging devices according to the embodiments is enhanced, specifically for the solid-state imaging devices having a large pixel size that is greater than 8 μm.

Figure 3A:
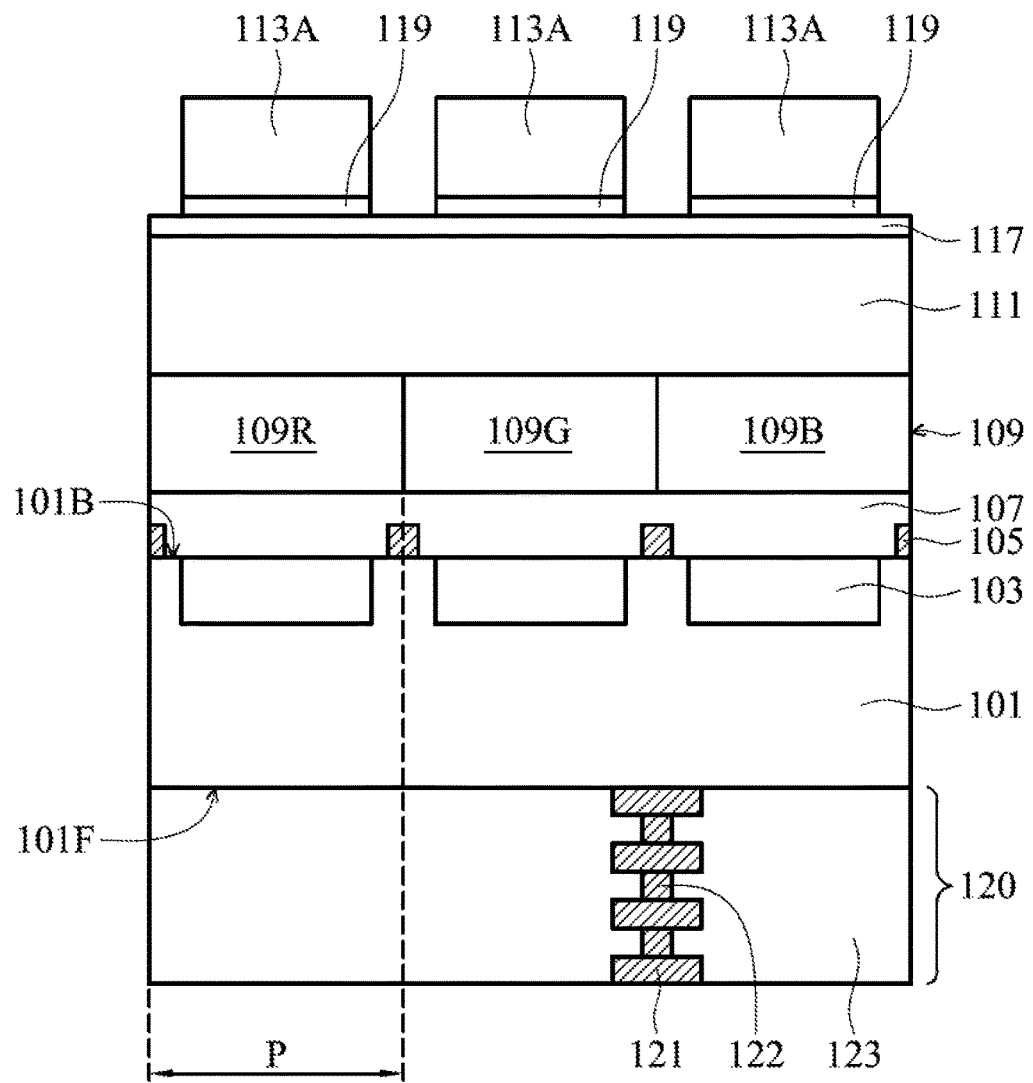
FIGS. 3A to 3E show schematic partial cross sections of various intermediate stages of a method of fabricating a solid-state imaging device according to some other embodiments.
Figure 3B:
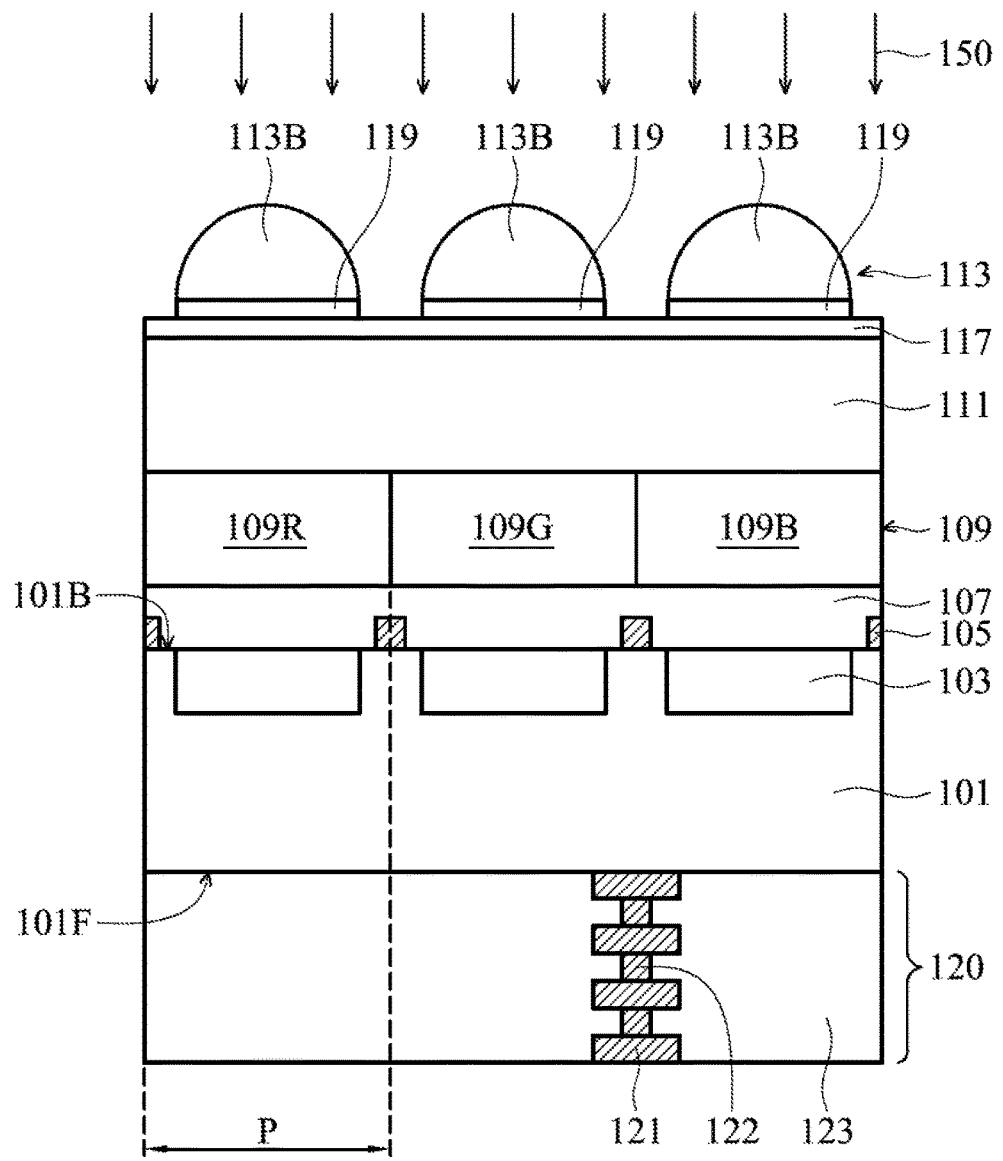
Figure 3C:
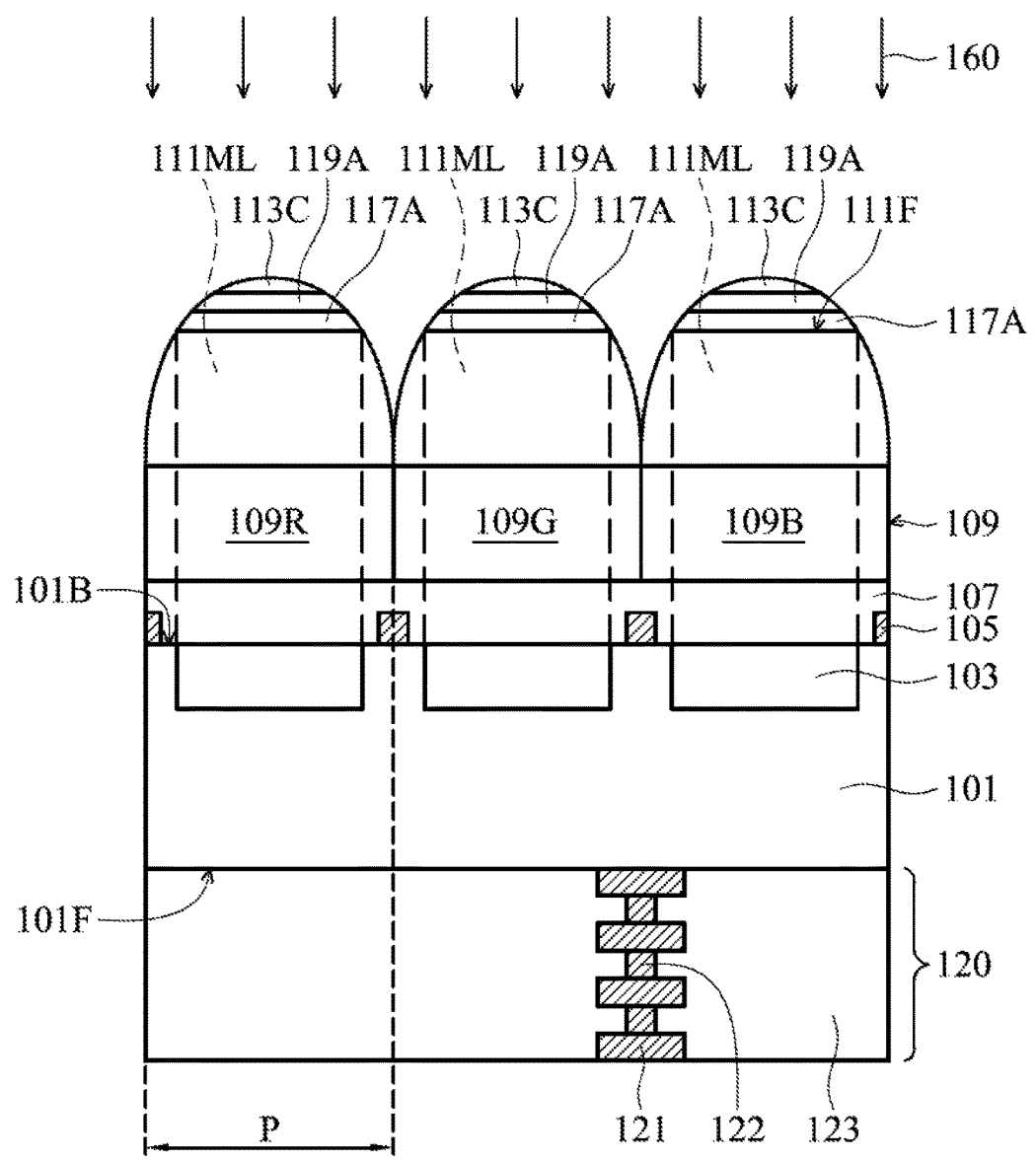
Figure 3D:
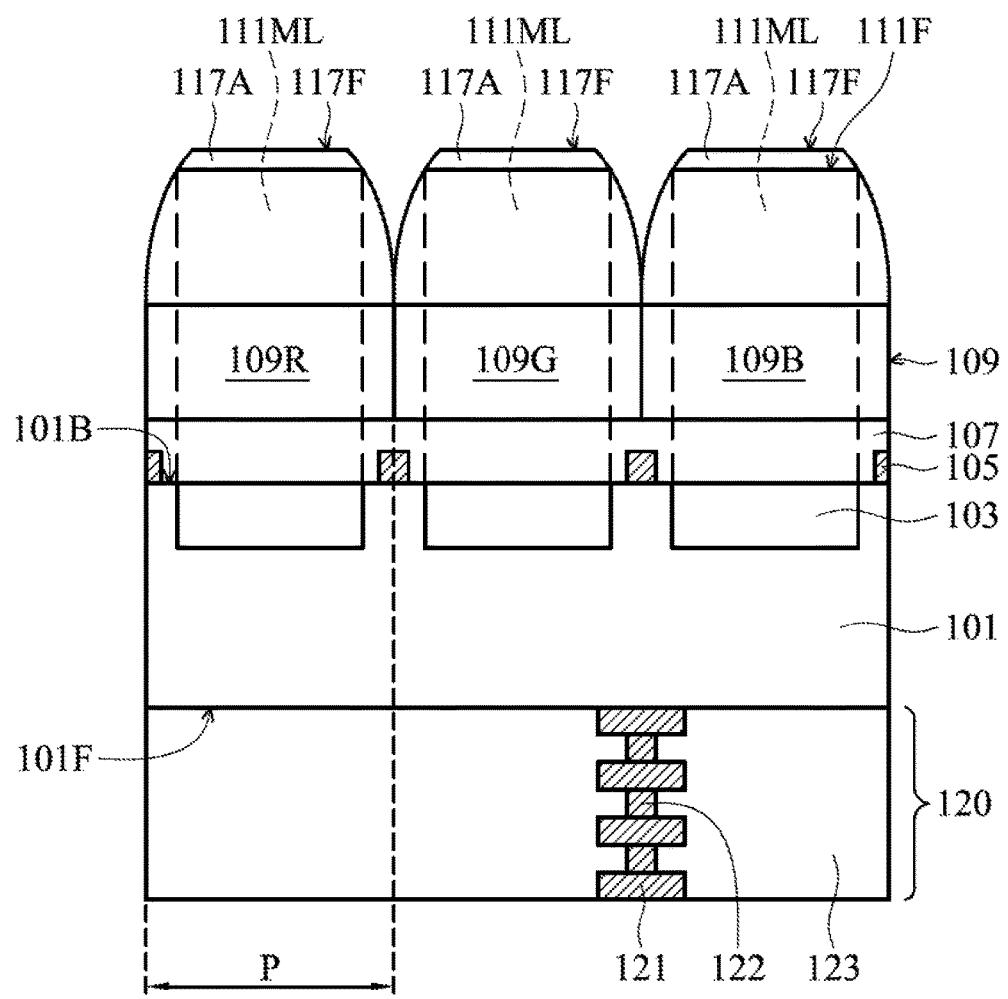
Figure 3E:
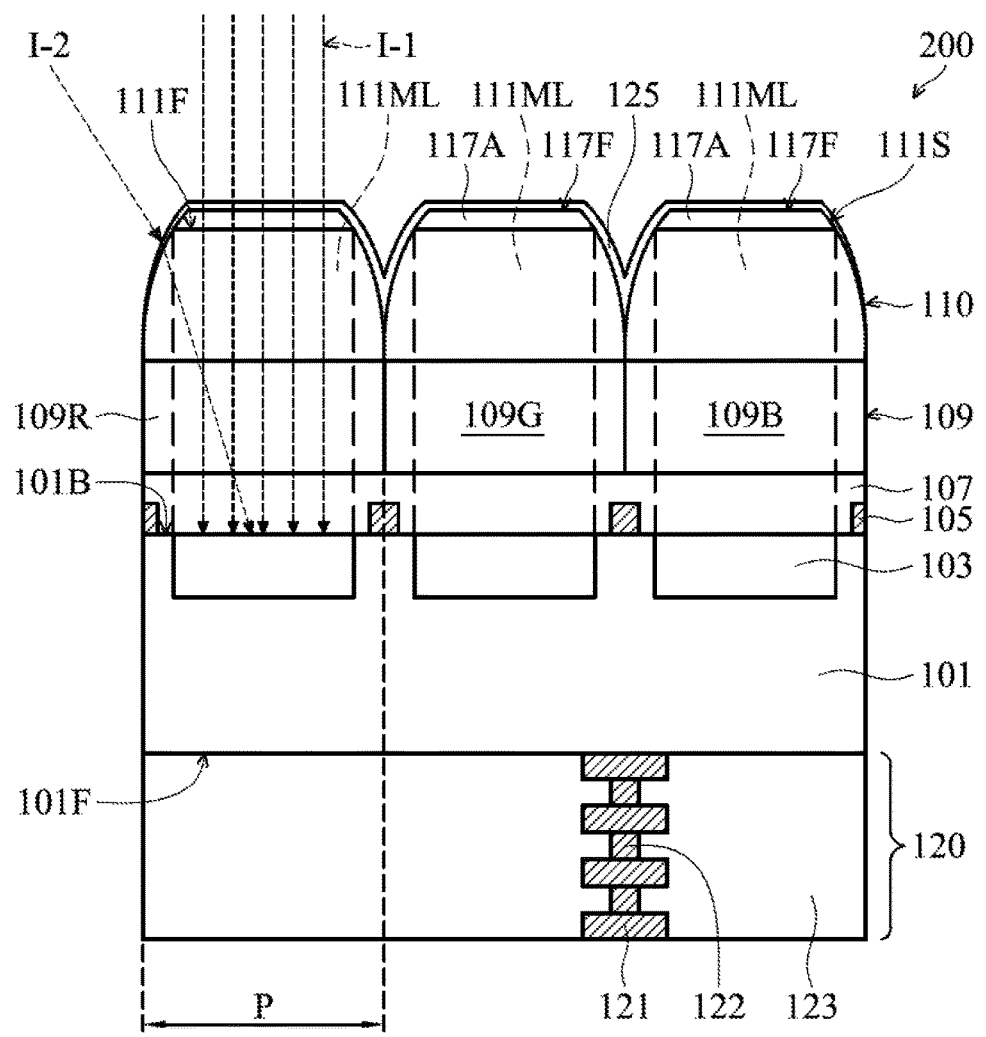

FIGS. 3A to 3E show schematic partial cross sections of various intermediate stages of a method of fabricating a solid-state imaging device 200 of FIG. 3E according to some embodiments. In the embodiments shown in FIGS. 3A to 3E, configurations, materials and fabrication processes of the semiconductor substrate 101, the photoelectric conversion elements 103, the interconnection layer 120, the light-shielding layer 105, the planarization layer 107, the color filter layer 109 and the lens material layer 111 can be the same as or similar to these illustrated in FIG. 1A, and are not repeated again to simplify the description.

Referring to FIG. 3A, a protection layer 117 is formed on the lens material layer 111. The protection layer 117 may be formed by a chemical vapor deposition (CVD) process. The material of the protection layer 117 may be silicon oxide, silicon nitride, silicon oxynitride or a combination thereof. The thickness of the protection layer 117 may be in a range of 0.1 um to 0.3 um.

A photoresist layer (not shown in FIG. 3A) is formed on the protection layer 117 by a spin-coating process. The photoresist layer is patterned by a photolithography technology including exposure and development processes to form a patterned photoresist 119 on the protection layer 117 as shown in FIG. 3A. Next, a hard mask material layer (not shown in FIG. 3A) is formed on the patterned photoresist 119. In some embodiments, the hard mask material layer is made of an organic material, for example: acrylic resin or epoxy resin. The hard mask material layer is patterned by a photolithography process and an etching process to form multiple hard mask segments 113A on the patterned photoresist 119 as shown in FIG. 3A. The hard mask segments 113A are directly on and are aligned with the patterned photoresist 119.

The multiple hard mask segments 113A are subsequently deformed into multiple lens-shaped patterns 113B of a hard mask 113 as shown in FIG. 3B by a reflow process. A maximum height of the lens-shaped patterns 113B of the hard mask 113 may be in a range of 4 μm to 15 μm. As shown in FIG. 3B, a dry-etching process 150 is performed on the lens-shaped patterns 113B of the hard mask 113, the patterned photoresist 119, the protection layer 117 and the lens material layer 111. In some embodiments, the lens-shaped patterns 113B of the hard mask 113, the patterned photoresist 119, the protection layer 117 and the lens material layer 111 are simultaneously etched during the dry-etching process 150. The dry-etching process 150 is performed using a fluorine-containing etchant, for example gas of $CF_4$, $CHF_3$, $C_4F_8$, $NF_3$ or a combination thereof. During the dry-etching process 150, the materials of the hard mask 113, the patterned photoresist 119, the protection layer 117 and the lens material layer 111 have individual and different etching rates. In the embodiments, an etching rate ratio of the materials of the hard mask 113 to the patterned photoresist 119, the protection layer 117 and the lens material layer 111 is in a range of 1.2:1.2:1.3:1 to 1.3:1.3:1.4:1.

After the dry-etching process 150 is finished, a partial profile of the lens-shaped patterns 113B of the hard mask 113 is transferred to the patterned photoresist 119, the protection layer 117 and the lens material layer 111 to form multiple microlenses 111ML. In the embodiments, each microlens 111ML has a flat top surface 111F as shown in FIG. 3C. Moreover, after the dry-etching process 150 is finished, a portion of the protection layer 117, which is shown as a remaining portion 117A in FIG. 3C, is that remains on the flat top surface 111F of the microlenses 111ML. Also, a portion of the patterned photoresist 119, which is shown as a remaining portion 119A in FIG. 3C, is that remains on the remaining portion 117A of the protection layer 117. In addition, a portion of the lens-shaped patterns 113B of the hard mask 113, which is shown as a remaining portion 113C in FIG. 3C, is that remains on the remaining portion 119A of the patterned photoresist 119.

Referring to FIG. 3C again, subsequently, a lift-off process 160 is performed to detach the remaining portion 119A of the patterned photoresist 119 from the remaining portion 117A of the protection layer 117. As a result, the remaining portion 113C of the hard mask 113 on the remaining portion 119A is also removed. In some embodiments, the lift-off process 160 is performed by dipping the structure of FIG. 3C in a solution, for example ethanolamine. In some other embodiments, the lift-off process 160 is performed by irradiating the structure of FIG. 3C to detach the remaining portion 119A of the patterned photoresist 119 from the remaining portion 117A of the protection layer 117. After the lift-off process 160, both the remaining portion 119A of the patterned photoresist 119 and the remaining portion 113C of the hard mask 113 are removed.

As shown in FIG. 3D, after the lift-off process 160, a flat top surface 117F of the remaining portion 117A of the protection layer 117 is exposed. The remaining portion 117A of the protection layer 117 is conformally formed on the flat top surface 111F of the microlens 111ML. The multiple microlenses 111ML are arranged into a microlens array 110. The microlens array 110 is also referred to as a flat microlens array. According to the embodiments, during the lift-off process 160, the remaining portion 117A of the protection layer 117 can protect the flat top surface 111F of the microlens 111ML. Therefore, the uniformity in flatness of the flat top surface 111F of the microlens 111ML is improved.

Referring to FIG. 3E, a passivation film 125 is conformally formed on the flat top surface 117F of the remaining portion 117A of the protection layer 117, and on the curved sidewalls 111S of the microlens 111ML to complete the solid-state imaging device 200. The passivation film 125 may be formed by a chemical vapor deposition (CVD) process. In some embodiments, the material of the passivation film 125 is the same as the material of the protection layer 117. In some other embodiments, the material of the passivation film 125 is different from the material of the protection layer 117. The material of the passivation film 125 may be silicon oxide, silicon nitride, silicon oxynitride or a combination thereof. In the embodiments, the thickness of the passivation film 125 is less than the thickness of the protection layer 117.

In the solid-state imaging device 200 of FIG. 3E, the flat top surface 111F of the microlens 111ML is directly above the photoelectric conversion element 103. Moreover, the area of the flat top surface 111F of the microlens 111ML is equal to the area of the photoelectric conversion element 103. The flat top surface 117F of the remaining portion 117A of the protection layer 117 is directly above the photoelectric conversion element 103. Moreover, the area of the flat top surface 117F of the remaining portion 117A of the protection layer 117 is slightly smaller than the area of the photoelectric conversion element 103. Through the flat top surface 111F of the microlens 111M, incident light I-1 can be focused in a big focus spot that is substantially equal to the area of one photoelectric conversion element 103. Moreover, incident light I-2 with a larger incident angle than that of incident light I-1 can be refracted by the curved sidewalls 111S of the microlens 111ML, and then reaches the photoelectric conversion element 103. As a result, the flat microlens array of the solid-state imaging device 200 can efficiently gather external light into the photoelectric conversion elements 103. Therefore, the sensitivity of the solid-state imaging devices 200 is enhanced, specifically for the solid-state imaging devices with a large pixel size greater than 8 μm.

Figure 4:
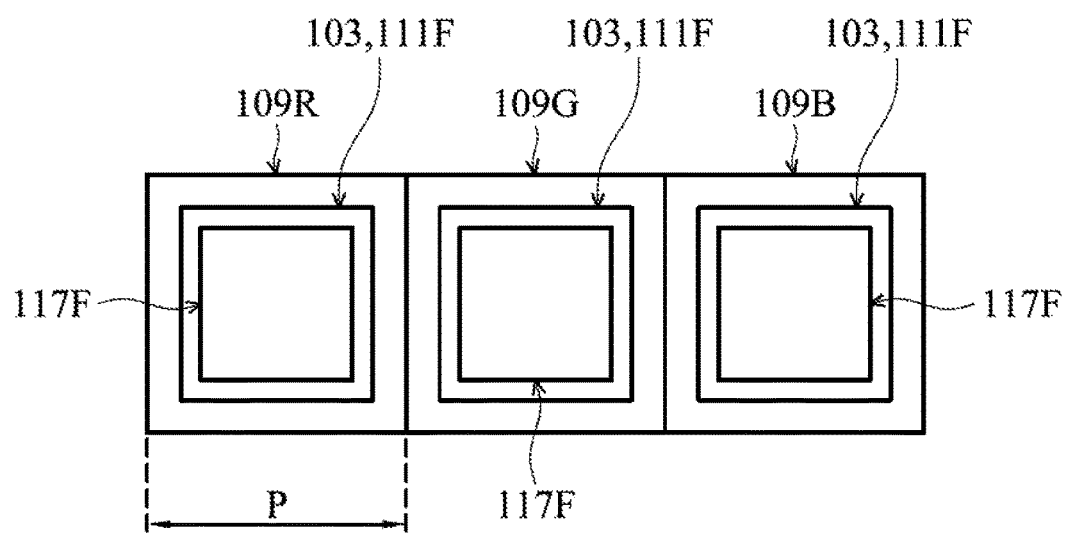
FIG. 4 shows a schematic partial plane view of the solid-state imaging device of FIG. 3E to illustrate the relationships of the areas of several elements according to some embodiments.

FIG. 4 shows a schematic partial plane view of the solid-state imaging device 200 of FIG. 3E to illustrate the relationships of the areas of the flat top surface 117F of the remaining portion 117A of the protection layer 117, the flat top surface 111F of the microlens 111M, the photoelectric conversion element 103 and the color filter components 109R, 109G and 109B according to some embodiments. As shown in FIG. 4, the area of the flat top surface 111F of the microlens 111M is equal to and is aligned with the area of the photoelectric conversion element 103 in one respective pixel P. The area of the respective color filter components 109R, 109G or 109B is equal to the area of one pixel P. In addition, the area of the flat top surface 117F of the remaining portion 117A of the protection layer 117 is slightly smaller than the area of the flat top surface 111F of the microlens 111M. In some embodiments, the area of the photoelectric conversion element 103 is equal to or greater than 75% of the area of one pixel P. When the solid-state imaging devices have a large pixel size, the effective photosensing area in one pixel is larger. The more effective photo-sensing area in a more larger pixel allows a bigger focus spot of incident light that is focused by the flat top surface 111F of the microlens 111M to be effectively received by the photoelectric conversion element 103.

According to the embodiments, solid-state imaging devices have a flat microlens array and methods of fabrication the solid-state imaging devices are provided. In the solid-state imaging devices, each microlens of the flat microlens array has a flat top surface. The flat microlens array is suitable for the solid-state imaging devices having a large pixel size, such as a pixel pitch that is greater than 8 μm or greater than 10 μm, and the pixel pitch is smaller than 30 μm. In the solid-state imaging devices, the flat microlens array can focus incident light on the photoelectric conversion element in a big focus spot that is substantially equal to the area of one photoelectric conversion element. Moreover, incident light with a large incident angle can also be refracted by the curved sidewalls of the flat microlens array. As a result, the flat microlens array can efficiently gather external light into the photoelectric conversion elements. Therefore, the sensitivity of the solid-state imaging devices is enhanced.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a solid-state imaging device, comprising:
    providing a semiconductor substrate having a plurality of photoelectric conversion elements;
    forming a color filter layer above the semiconductor substrate;
    forming a lens material layer on the color filter layer;
    forming a hard mask having a lens-shaped pattern on the lens material layer;
    etching both the hard mask and the lens material layer to form a microlens with a flat top surface from the lens material layer and to leave a portion of the hard mask on the flat top surface of the microlens, wherein the etching of both the hard mask and the lens material layer is performed using a first dry-etching process using a fluorine-containing etchant; and
    removing the portion of the hard mask that remains on the microlens.

2. The method as claimed in claim 1, wherein the material of the hard mask has an etching rate that is different from the etching rate of the material of the lens material layer in the first dry-etching process.

3. The method as claimed in claim 2, wherein an etching rate ratio of the hard mask to the lens material layer is in a range of 1:1 to 1.2:1.

4. The method as claimed in claim 1, wherein the removing the portion of the hard mask that remains on the microlens is performed using a second dry-etching process using an etchant that is different from the fluorine-containing etchant used in the first dry-etching process.

5. The method as claimed in claim 1, after the removing the portion of the hard mask that remains on the microlens, further comprising conformally forming a passivation film on the microlens, wherein the passivation film is formed by a chemical vapor deposition process, and the material of the passivation film comprises silicon oxide, silicon nitride, silicon oxynitride or a combination thereof.

6. The method as claimed in claim 1, wherein the flat top surface of the microlens is directly above the photoelectric conversion element, and the area of the flat top surface of the microlens is equal to the area of the photoelectric conversion element.

7. The method as claimed in claim 1, wherein the material of the hard mask comprises a photosensitive organic material, and the formation of the hard mask is performed using a photolithography process and a reflow process on the photosensitive organic material to form the lens-shaped pattern of the hard mask.

8. A method of fabricating a solid-state imaging device, comprising:
    providing a semiconductor substrate having a plurality of photoelectric conversion elements;
    forming a color filter layer above the semiconductor substrate;
    forming a lens material layer on the color filter layer;
    forming a patterned photoresist above the lens material layer;
    forming a hard mask having a lens-shaped pattern on the patterned photoresist;
    etching the hard mask, the patterned photoresist and the lens material layer to form a microlens with a flat top surface, the microlens is formed from the lens material layer, and to leave a portion of the patterned photoresist and a portion of the hard mask above the flat top surface of the microlens, wherein the etching of the hard mask, the patterned photoresist and the lens material layer is performed using a dry-etching process using a fluorine-containing etchant; and
    removing the portion of the patterned photoresist and the portion of the hard mask above the flat top surface of the microlens.

9. The method as claimed in claim 8, further comprising forming a protection layer between the lens material layer and the patterned photoresist, wherein the protection layer is also etched by the dry-etching process to leave a portion of the protection layer on the flat top surface of the microlens.

10. The method as claimed in claim 9, wherein an etching rate ratio of the hard mask to the patterned photoresist, the protection layer and the lens material layer in the dry-etching process is in a range of 1.2:1.2:1.3:1 to 1.3:1.3:1.4:1.

11. The method as claimed in claim 9, wherein the removing the portion of the patterned photoresist and the portion of the hard mask above the flat top surface of the microlens is performed using a lift-off process, and the portion of the protection layer that remains on the flat top surface of the microlens is not removed by the lift-off process.

12. The method as claimed in claim 9, further comprising conformally forming a passivation film on the portion of the protection layer that remains on the flat top surface of the microlens and on sidewalls of the microlens.

13. The method as claimed in claim 12, wherein the passivation film has a thickness that is less than the thickness of the protection layer.

14. The method as claimed in claim 12, wherein the protection layer is formed by a first chemical vapor deposition process and the passivation film is formed by a second chemical vapor deposition process.

* * * * *